(12) United States Patent
Cho et al.

(10) Patent No.: US 10,403,473 B2
(45) Date of Patent: Sep. 3, 2019

(54) ION BEAM ETCHING DEVICES

(71) Applicants: Han-Na Cho, Incheon (KR); Jong-Kyu Kim, Seongnam-si (KR); Hyuk Kim, Seongnam-si (KR); Jongchul Park, Seongnam-si (KR)

(72) Inventors: Han-Na Cho, Incheon (KR); Jong-Kyu Kim, Seongnam-si (KR); Hyuk Kim, Seongnam-si (KR); Jongchul Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 218 days.

(21) Appl. No.: 15/198,416

(22) Filed: Jun. 30, 2016

(65) Prior Publication Data

US 2017/0092465 A1    Mar. 30, 2017

(30) Foreign Application Priority Data

Sep. 24, 2015  (KR) .......................... 10-2015-0135697

(51) Int. Cl.
 *H01J 37/32* (2006.01)

(52) U.S. Cl.
 CPC .... *H01J 37/32009* (2013.01); *H01J 37/3266* (2013.01); *H01J 37/32357* (2013.01); *H01J 37/32403* (2013.01); *H01J 37/32422* (2013.01); *H01J 37/32669* (2013.01); *H01J 37/32715* (2013.01)

(58) Field of Classification Search
 CPC combination set(s) only.
 See application file for complete search history.

(56) References Cited

U.S. PATENT DOCUMENTS

| 5,036,252 | A | 7/1991 | Lob |
| 2002/0004309 | A1* | 1/2002 | Collins ................. C23C 16/507 438/719 |
| 2004/0233027 | A1* | 11/2004 | Oster ....................... G21B 1/11 335/306 |
| 2014/0209244 | A1* | 7/2014 | Banna ............... H01J 37/32651 156/345.49 |

FOREIGN PATENT DOCUMENTS

| JP | H07-193047 A | 7/1995 |
| JP | 2004-241614 A | 8/2004 |
| JP | 2007-134428 A | 5/2007 |

* cited by examiner

*Primary Examiner* — Joseph A Miller, Jr.
(74) *Attorney, Agent, or Firm* — Harness, Dickey & Pierce, P.L.C.

(57) ABSTRACT

An ion beam etching device comprises: an ion source configured to generate ions; a grid on a side of the ion source, the grid configured to accelerate the generated ions to generate an ion beam; a process chamber configured to have an etching process using the ion beam performed therein; and a variable magnetic field application part adjacent to the process chamber, the variable magnetic field application part configured to apply a variable magnetic field.

6 Claims, 16 Drawing Sheets

ION BEAM ETCHING DEVICES

CROSS-REFERENCE TO RELATED APPLICATION

This application claims priority under 35 U.S.C. § 119 to Korean Patent Application No. 10-2015-0135697 filed on Sep. 24, 2015, the disclosure of which is hereby incorporated by reference in its entirety.

BACKGROUND

Field

Example embodiments of inventive concepts relate to ion beam etching devices.

Description of Related Art

Various techniques for performing an etching process using ion beams are utilized. As semiconductor devices more become highly integrated and wafer size increases, improvement of process accuracy is required. However, improvement of process accuracy may be limited by divergence caused by repulsive force between positive ions used as an ion beam, and/or the like.

SUMMARY

Example embodiments of inventive concepts provide ion beam etching devices having more accurate etching performance.

Example embodiments of inventive concepts provide ion beam etching devices capable of reducing etching scattering.

Inventive concepts are not limited to the above disclosure, and other objectives may become apparent to those of ordinary skill in the art based on the following descriptions.

According to at least one example embodiment, an ion beam etching device comprises: an ion source configured to generate ions; a grid on a side of the ion source, the grid configured to accelerate the generated ions to generate an ion beam; a process chamber configured to have an etching process using the ion beam performed therein; and a variable magnetic field application part adjacent to the process chamber, the variable magnetic field application part configured to apply a variable magnetic field.

According to at least some example embodiments, the process chamber may have a cylindrical shape, and the variable magnetic field application part may include electromagnets arranged on an outer surface of the process chamber in a radial shape.

According to at least some example embodiments, the electromagnets may comprise a first electromagnet and a second electromagnet separated from the first electromagnet. A current applied to the first electromagnet maybe different from a current applied to the second electromagnet.

According to at least some example embodiments, the variable magnetic field application part may further comprise a controller configured to control a current applied to each of the electromagnets.

According to at least some example embodiments, the variable magnetic field application part may further comprise a driving part configured to move the electromagnets.

According to at least some example embodiments, the driving part may be configured to move the electromagnets in a direction perpendicular or substantially perpendicular to a surface of the grid.

According to at least some example embodiments, the variable magnetic field application part may further comprise a coil wound around a sidewall of the process chamber.

According to at least some example embodiments, the variable magnetic field application part may further comprise a controller configured to control a current applied to the coil.

According to at least some example embodiments, the variable magnetic field application part may further comprise a driving part configured to move the coil.

At least one other example embodiment provides an ion beam etching device comprising: a variable magnetic field application part configured to apply a variable magnetic field to a progressing path of an ion beam emitted from an ion source.

According to at least some example embodiments, the variable magnetic field application part may be configured to generate a magnetic field based on received current.

According to at least some example embodiments, the variable magnetic field application part may comprise a magnet having a variable position.

According to at least some example embodiments, the variable magnetic field application part may comprise a coil having a variable position.

According to at least some example embodiments, a magnetic field distribution of the variable magnetic field is asymmetric on a plane perpendicular or substantially perpendicular to the progressing path of the ion beam.

According to at least some example embodiments, the variable magnetic field application part may comprise electromagnets arranged adjacent to the progressing path of the ion beam in a radial shape.

At least one other example embodiment provides an ion beam etching device comprising: a chamber including a stage, the stage configured to hold a substrate; an ion beam source configured to output an ion beam toward the stage; an electromagnetic force application part configured to apply an electromagnetic force to the ion beam, the electromagnetic force application part including an electromagnetic force generator configured to move along the chamber.

According to at least some example embodiments, the electromagnetic force may be a variable electromagnetic force, and the electromagnetic force generator may be configured to generate the variable electromagnetic force based on an applied current.

According to at least some example embodiments, the electromagnetic force application part may further comprise a driving part configured to move the electromagnetic force generator along the chamber.

According to at least some example embodiments, the electromagnetic force generator includes at least one of an electromagnet and a coil.

According to at least some example embodiment, the electromagnetic force generator may be configured to apply the electromagnetic force asymmetrically within the chamber.

BRIEF DESCRIPTION OF THE DRAWINGS

Example embodiments of inventive concepts will be described with regard to the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Figure 1:
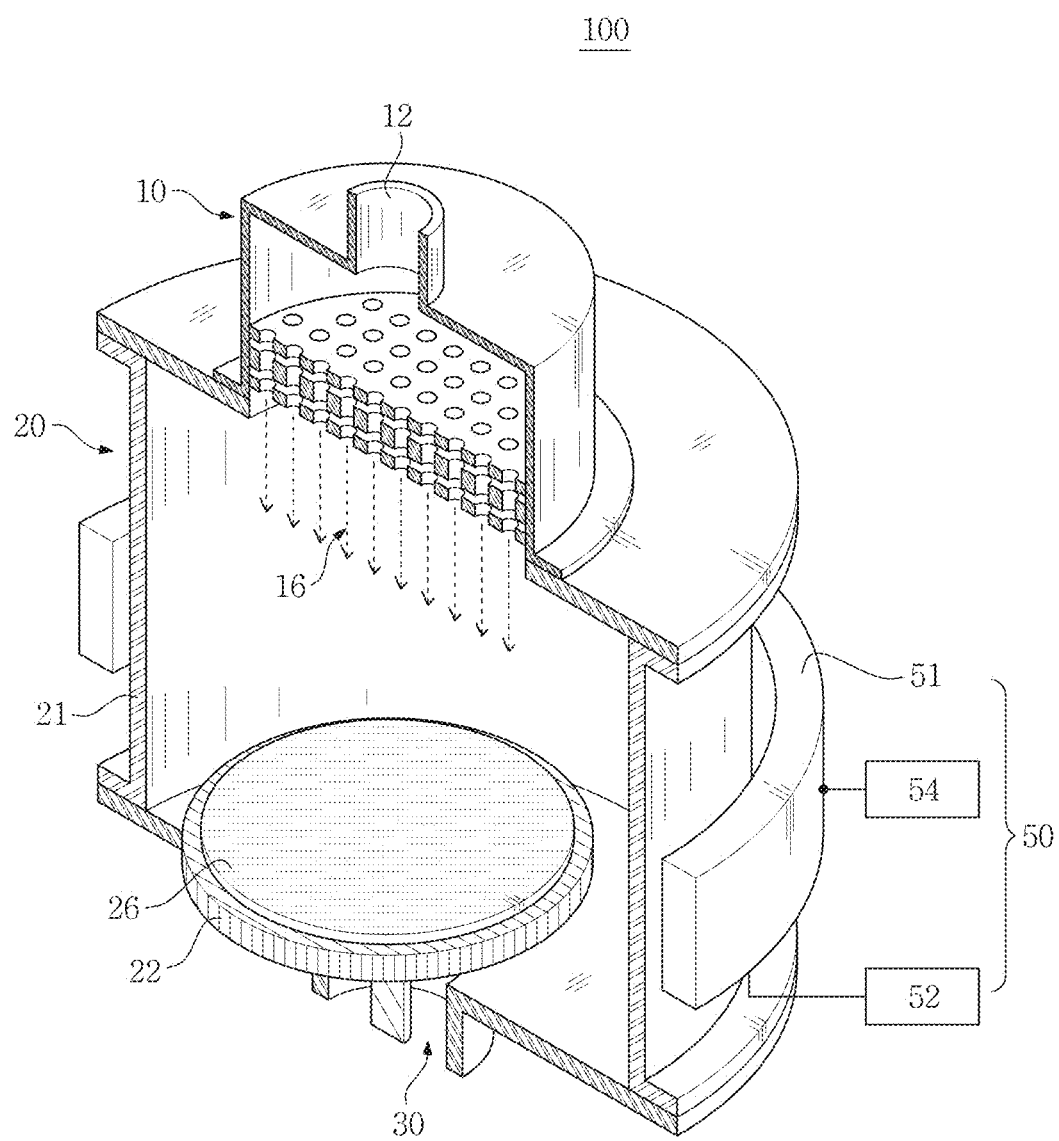
FIG. 1 is a view illustrating an ion beam etching device in accordance with example embodiments of inventive concepts.

Various example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Units, controllers and/or devices (e.g., the controller 54 discussed in more detail below) according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units, controllers and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the present specification, relative terms such as "front side" and "back side" are used herein as relative concepts to describe the example embodiments of inventive concepts for easy understanding. Thus, the terms "front side" and "back side" do not necessarily indicate specific directions, locations, or elements but can be used interchangeably. For example, a term "front side" may be interpreted as a term "back side," and a term "back side" may be interpreted as a term "front side." Accordingly, the term "front side" may be expressed as a term "first side," and a term "back side" may be expressed as a term "second side." Conversely, a term "back side" may be expressed as a term "first side," and a term "front side" may be expressed as a term "second side." However, the terms "front side" and "back side" are not used in the same sense in connection with example embodiments.

In the present specification, a term such as "near" used herein indicates that any one of at least two elements having symmetrical concepts is disposed nearer to another specific element than the others thereof. For example, the expression such as a first end is close to a first side may be interpreted that the first end is closer to the first side than a second end, or the first end is closer to the first side than a second side.

Figure 3A:
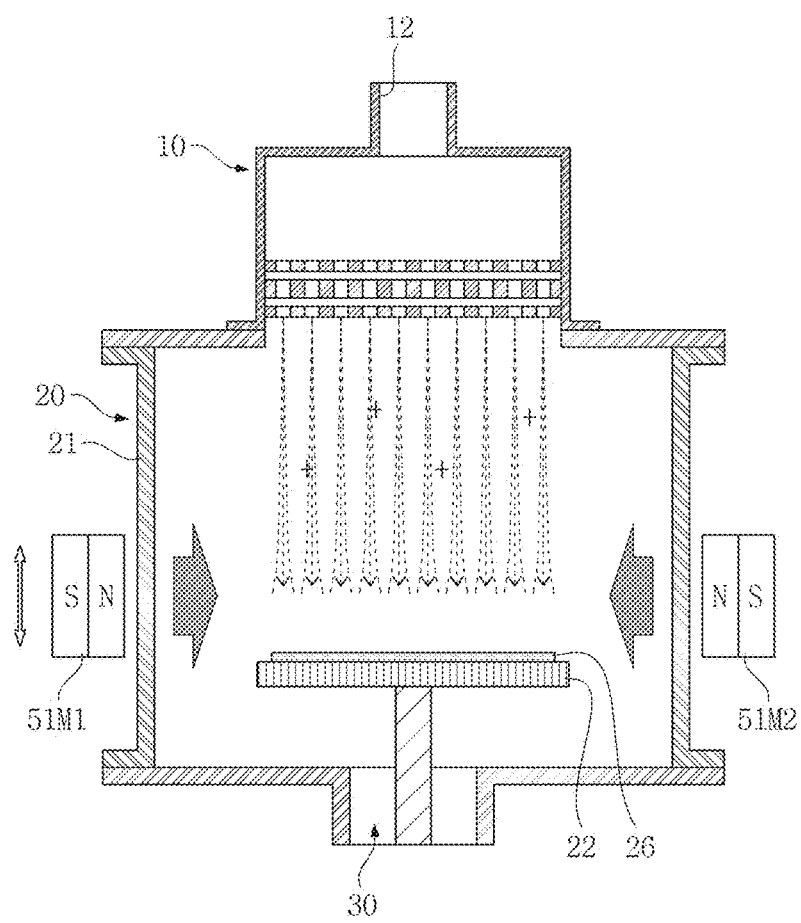
FIG. 3A is a view illustrating an ion beam etching device in accordance with example embodiments of inventive concepts.
Figure 3B:
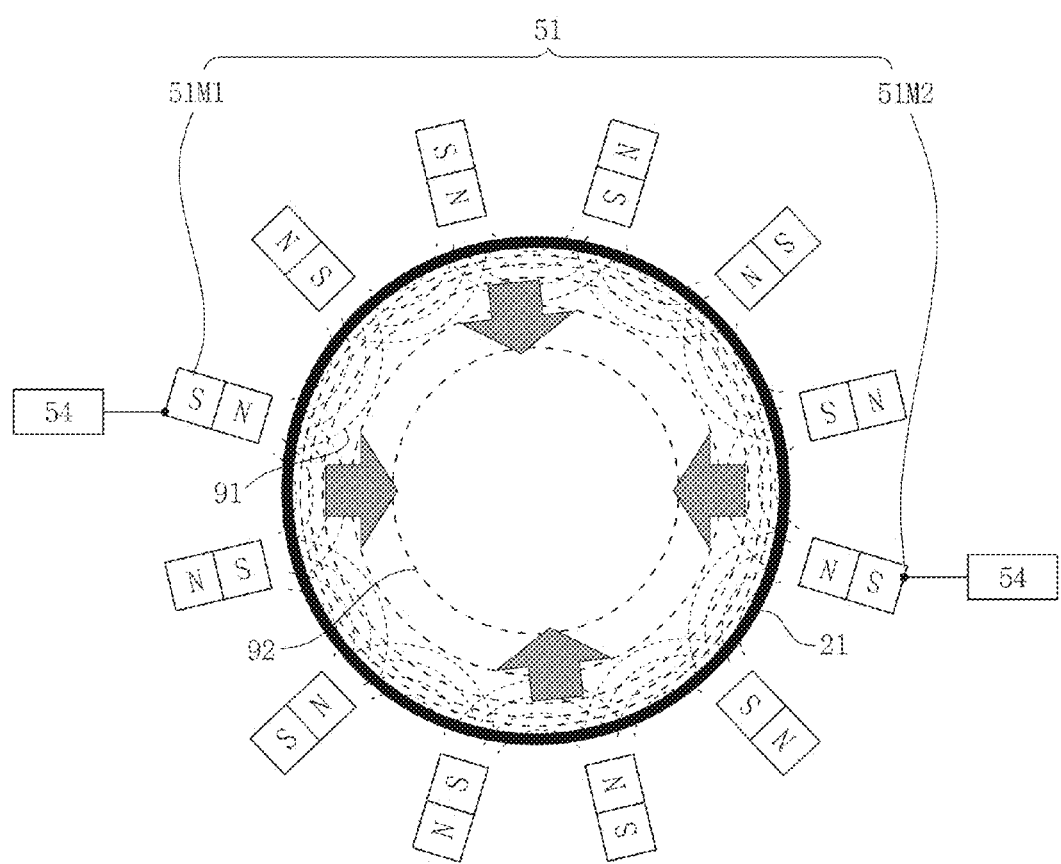
FIG. 3B is a view illustrating an ion beam etching device in accordance with example embodiments of inventive concepts.
Figure 3C:
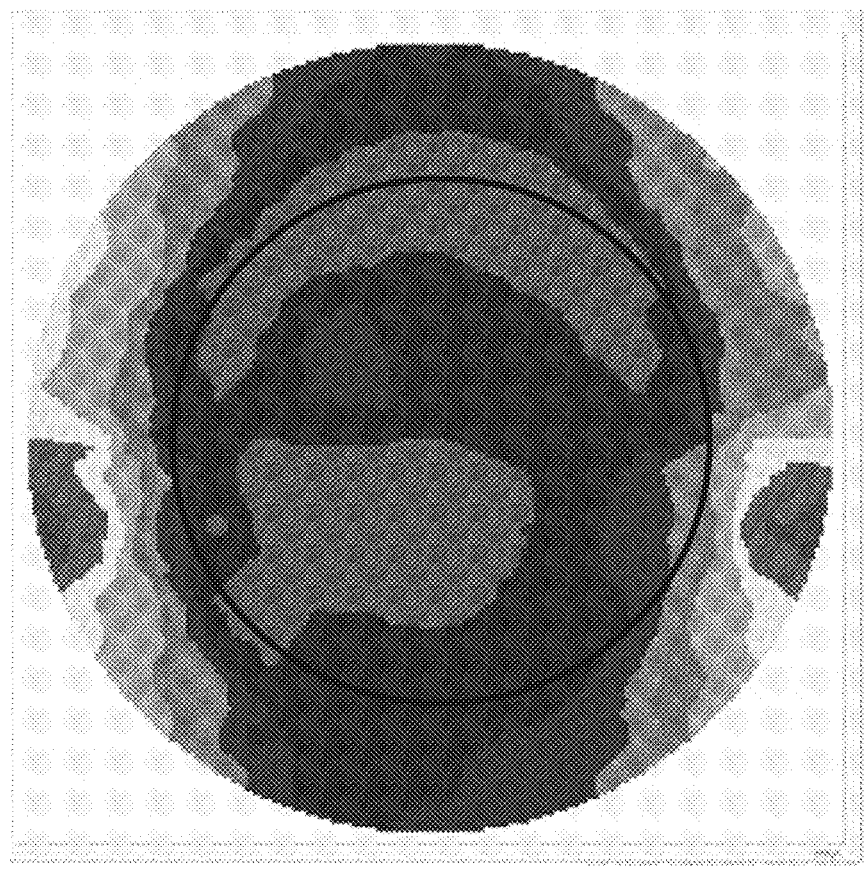
FIG. 3C is a view for describing an example of etching scattering.
Figure 4A:
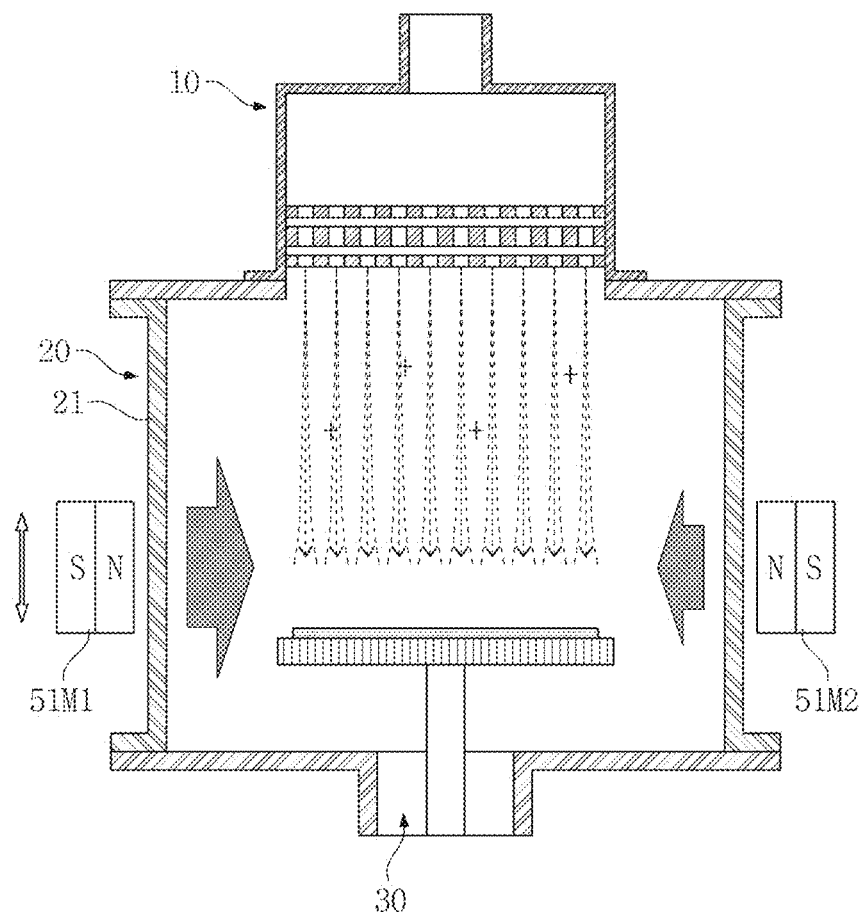
FIG. 4A is a view illustrating an ion beam etching device in accordance with example embodiments of inventive concepts.
Figure 4B:
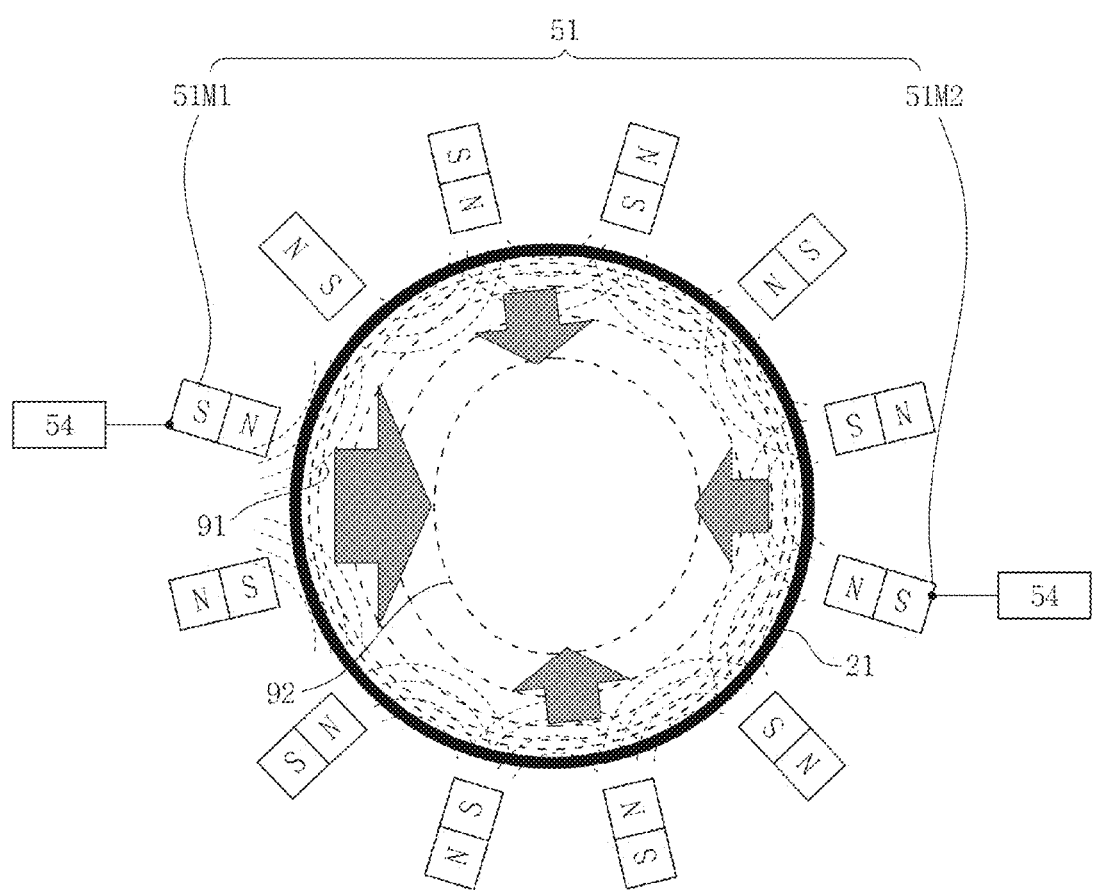
FIG. 4B is a view illustrating an ion beam etching device in accordance with example embodiments of inventive concepts.
Figure 4C:
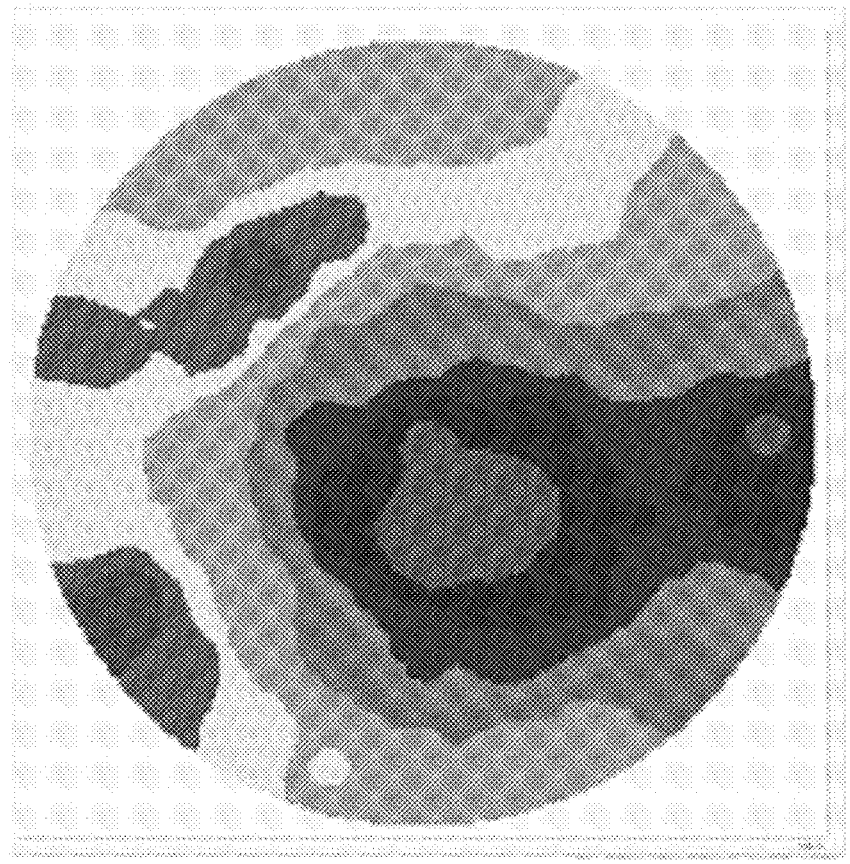
FIG. 4C is a view for describing another example of etching scattering.

FIGS. 1, 2A, 3A, 3B, 4A, 4B, 5A, and 5B are views for describing ion beam etching devices in accordance with example embodiments of inventive concepts. FIG. 2B is a schematic view taken along line I-I' of FIG. 2A. FIG. 2C is a view for describing an example modified from that shown in FIG. 2A. FIGS. 3C and 4C are views illustrating examples of etching scattering. FIG. 5C is a view for describing a dynamic relationship applied on ions in the ion beam etching device in accordance with the example embodiments of the inventive concepts. FIG. 6A is a view before and after etching. FIG. 6B is a view showing an example when etching is performed without application of an etching scattering improvement function. FIG. 6C is a view showing an example when etching is performed with application of an etching scattering improvement function in an ion beam etching device in accordance with example embodiments of inventive concepts.

Figure 2A:
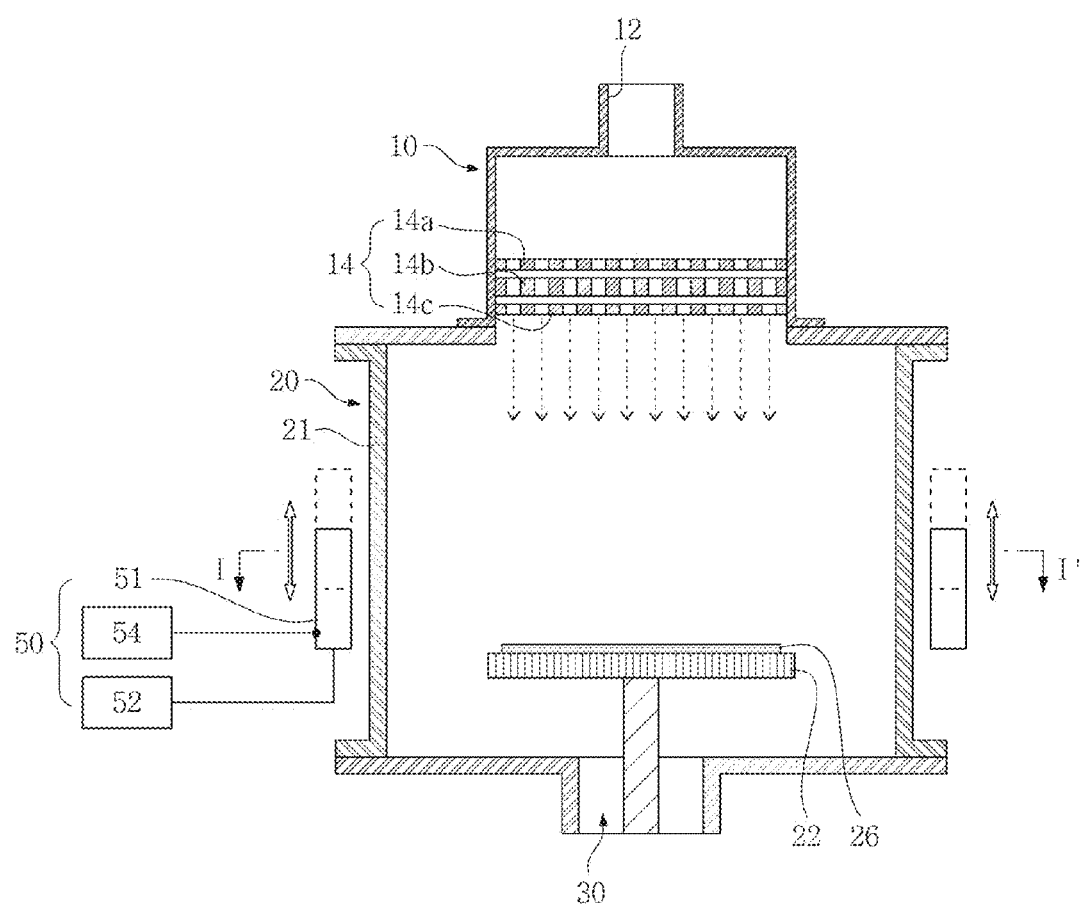
FIG. 2A is a view illustrating the ion beam etching device in accordance with example embodiments of inventive concepts.
Figure 2B:
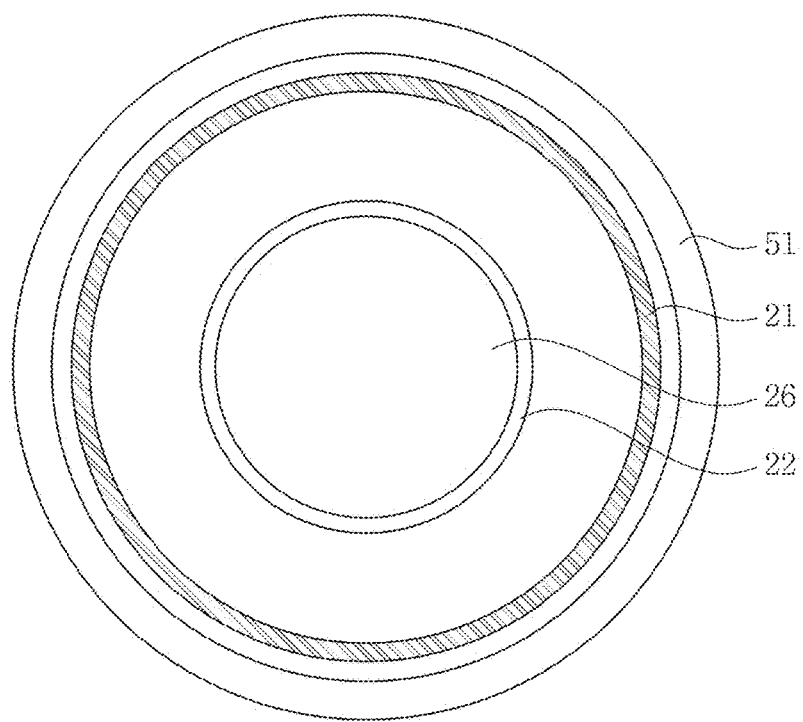
FIG. 2B is a schematic view taken along line I-I' of FIG. 2A.
Figure 2C:
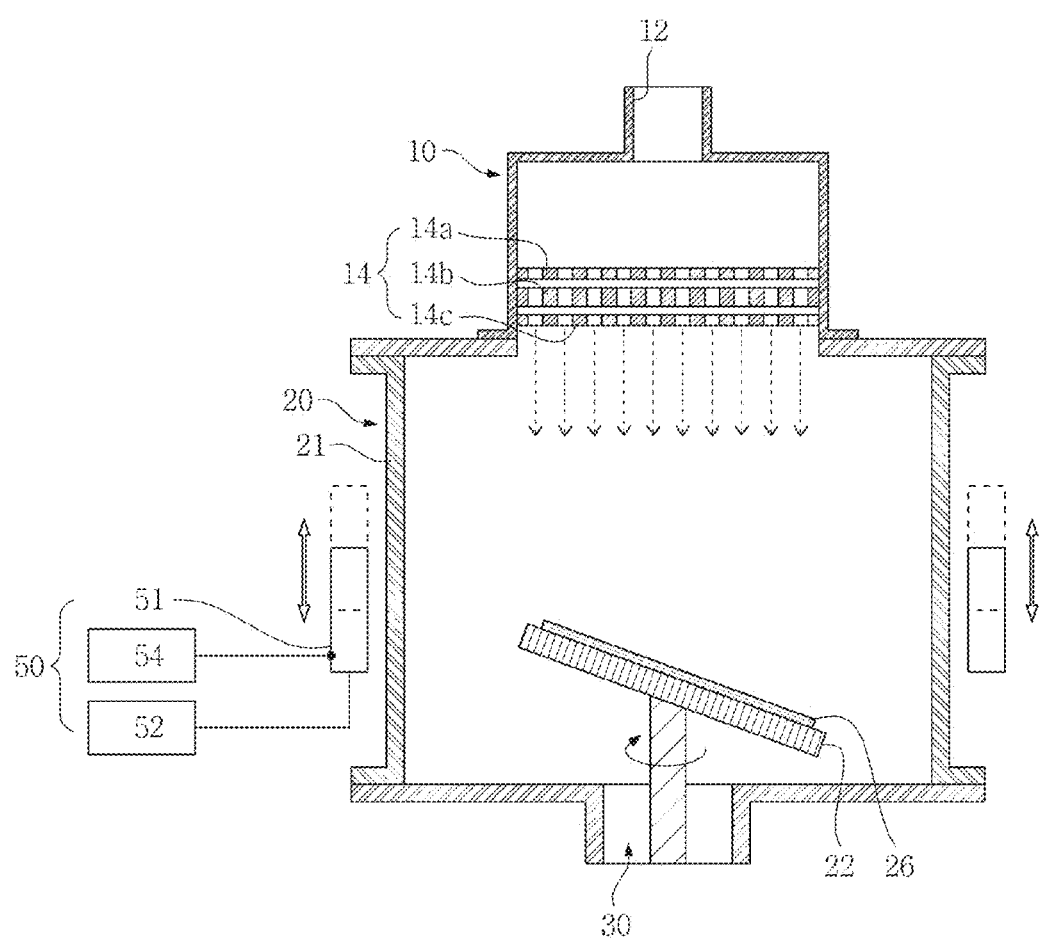
FIG. 2C is a view for describing an example modified from that shown in FIG. 2A.

Referring to FIGS. 1, 2A, and 2B, an ion beam etching device 100 in accordance with example embodiments of inventive concepts may include an ion source 10, a grid 14, a process chamber 20, and a variable magnetic field application part 50. The ion beam etching device 100 may be used in a process of etching a surface of a substrate 26 such as a wafer, etc.

Although described with regard to a variable magnetic field application part, the variable magnetic field application part 50 may be a variable electromagnetic force application part, configured to apply a variable electromagnetic force to the ion beam.

The ion source 10 may be in fluid communication with the process chamber 20 through the grid 14. According to at least some example embodiments the process chamber 20 may be formed in a cylindrical shape. The process chamber 20 may have a circular cylindrical shape or a polygonal pillar shape such as a quadrangular pillar shape, etc. The process chamber 20 may be formed of a non-conductive material such as quartz, pyrex, etc. In one or more example embodiments, walls except an upper part and a lower part among walls of the process chamber 20 are referred to as sidewalls 21.

The ion source 10 may include a gas inlet 12. Plasma may be generated in the ion source 10 through an induction combination radio frequency (RF) stimulation (an RF source and an induction coil are not shown) of a process gas (or a gas mixture) injected into the ion source 10 through the gas inlet 12. Collimated ion beams 16 may be extracted from the plasma generated in the ion source 10. The grid 14 may include a first grid 14a, a second grid 14b, and a third grid 14c. The first grid 14a may contact the plasma and control an electric potential thereof. A voltage of about 100 to about 1,500 V may be applied to the first grid 14a to accelerate the ions. The second grid 14b may be operated by a relatively high voltage of negative polarity. For example, a voltage of about −500 to about −2,000 V may be applied to the second grid 14b. The third grid 14c may be grounded. Ion particles may be accelerated by the electric potential applied to the first grid 14a on a plasma interface formed in the ion source 10, and the ion particles may be emitted in a direction toward the second grid 14b. Focusing of the ion beam may be adjusted by the electric potential applied to the second grid 14b. Since the third grid 14c is grounded, reverse flow of projected or emitted ions may be suppressed and/or prevented.

An upper portion of the process chamber 20 may be in fluid communication with the ion source 10, and the grid 14 may be formed at an interface between the ion source 10 and the process chamber 20. A pumping port 30 may be formed under the process chamber 20. A stage 22 may be formed in the process chamber 20, and the substrate 26, such as a wafer, etc., may be disposed on the stage 22.

Ions, such as positive argon ions (Ar+), positive helium ions (He+), positive xenon ions (Xe+), and/or the like, which have passed through the grid 14, may have a deviation of emission angles while passing through the grid 14. A through-hole surface through which the ions pass or are emitted may be non-uniform. Deviation may exist between a plurality of through-holes formed in a surface of the grid 14. Ions having emission angles undesired by a designer may be emitted from the grid 14. A phenomenon of passing through the grid 14 and generating a deviation of the emission angle may be referred to as a steering phenomenon.

A repulsive force may be generated between positive ions forming an ion beam. Intervals between the positive ions may be increased by the repulsive force. A phenomenon in which the intervals between the positive ions are increased is referred to as a divergence phenomenon.

Non-uniformity of density of ions arriving at the substrate 26 during an etching process using the ion beam may be increased by the above-described steering phenomenon and/or divergence phenomenon. By the above-described steering phenomenon and/or divergence phenomenon, non-uniformity of impact angles of the ions impacting the substrate 26 during the etching process using the ion beam may be increased. The increase in the non-uniformity may cause an etching scattering, such as a center-edge scattering and/or the like, on the substrate 26. The etching scattering may include, for example, a circular scattering as illustrated in FIG. 3C, an irregular (asymmetric) scattering as illustrated in FIG. 4C, and/or the like.

The variable magnetic field application part 50 may be formed adjacent to the process chamber 20. In one or more example embodiments, the variable magnetic field may refer to a magnetic field in which a distribution of lines 91 of magnetic force and/or direction of magnetic flux is variable. In one or more example embodiments of inventive concepts, the variable magnetic field application part 50 may change positions of the lines 91 of magnetic force, a density of magnetic flux, a direction of magnetic flux, and/or the like in 3-dimensional space.

In one or more example embodiments of inventive concepts, the variable magnetic field application part 50 may include a magnetic field generator 51. The magnetic field generator 51 may be realized by a magnet, an electromagnet, a coil 51C, and/or the like. The magnetic field generator 51 may generate a magnetic field. The magnetic field generator may also be referred to as an electromagnetic force generator. The electromagnetic force generator may be configured to generate an electromagnetic force.

In one or more example embodiments of inventive concepts, the variable magnetic field application part 50 may include a driving part 52 in addition to the magnetic field generator 51. The driving part 52 may change a position of the magnetic field generator 51. In one or more example embodiments of inventive concepts, the magnetic field generator 51 may be transported in a direction parallel or substantially parallel to a progressing path of the ion beam emitted from the grid 14. In one or more example embodiments of inventive concepts, the magnetic field generator 51 may move in a vertical direction along the sidewall 21 of the process chamber 20. The progressing path of the ion beam may be from a lower surface of the grid 14 toward a lower portion of the process chamber 20. The lower surface of the grid 14 may face the stage 22. The driving part 52 may include a guide part (not shown) configured to provide a moving path of the magnetic field generator 51. The magnetic field generator 51 may move along the guide part (not shown). The magnetic field generator 51 may be in contact (e.g., direct contact) with the process chamber 20, and may move along the sidewall 21 of the process chamber 20. In this case, the sidewall 21 of the process chamber 20 may serve as the above-described guide part (not shown). The driving part 52 may include a motor (not shown), an oil pressure and/or air pressure cylinder (not shown), and/or the like, to generate a driving force. Such a motor, a cylinder, and/or the like, may be provided inside or outside the magnetic field generator 51.

In one or more example embodiments of inventive concepts, the variable magnetic field application part 50 may include the magnetic field generator 51 and a controller 54. The magnetic field generator 51 may be realized by electromagnets and/or the coil 51C. The controller 54 may be electrically connected to the electromagnets and/or the coil 51C. The controller 54 may adjust a current applied to the electromagnets and/or the coil 51C. A magnetic field is generated by the current applied to the electromagnets and/or the coil 51C, wherein the current is adjustable. The magnetic field may be controlled and have a distribution or intensity, which may decrease the above-described etching scattering.

Referring to FIG. 2C, the stage 22 may be arranged obliquely. In this case, the substrate 26 on the stage 22 may also be arranged obliquely, and an incident angle of the ion beam incident on the substrate 26 may be adjusted as desired.

A layered structure may be formed of various materials on a surface of the substrate 26. An example of the layered structure is described with reference to FIGS. 6A, 6B, and 6C. The magneto-resistance random access memory (MRAM) shown in FIG. 6A may include a layered structure including a substrate 26-1, an interlayer insulating layer 26-2, a lower electrode 26-3, a fixed magnetic layer 26-4, a tunnel junction layer 26-5, a magnetic free layer 26-6, and an upper electrode 26-7. Etching ratios of the materials with respect to incident angles may be different. As shown in FIG. 2C, an angle of incline of the stage 22 may be adjusted, and thus, the layered structure formed of the various materials may be etched more accurately. In at least some example embodiments, when the substrate 26 is positioned obliquely, the stage 22 may be rotated and the uniformity of etching may be improved.

Referring to FIGS. 3A and 3B, the magnetic field generator 51 may be realized by the magnets 51M1 and 51M2 arranged adjacent to the process chamber 20. The magnets 51M1 and 51M2 may be arranged in a radial shape at the outside of the sidewall 21 of the process chamber 20 in a cylindrical shape. The magnets 51M1 and 51M2 may be arranged in a radial shape at the outside of the sidewall 21 of the process chamber 20 of a hollow polygonal pillar shape. The magnets 51M1 and 51M2 may be separated from each other by a given (or, alternatively, desired or predetermined) distance with respect to the center of the process chamber 20. For convenience of description, only two magnets are displayed and identified by reference numerals 51M1 and 51M2. In the figures, an object masked as "NIS" also represents a magnet in addition to the reference numerals 51M1 or 51M2. The controller 54 is also described as being connected to the first electromagnet 51M1 and the second electromagnet 51M2, but the controller 54 may be connected to different electromagnets. The number, intervals, thicknesses, and/or the like of the magnets may be suitably selected and applied.

A type of a magnetic mirror surface 92 may be formed by lines 91 of magnetic forces formed adjacent to the magnets 51M1 and 51M2. The magnetic mirror surface 92 may perform an operation of pushing charged particles, which start from the grid 14, to the substrate 26 in a direction toward the center of the process chamber 20. Coherence of the ion beam may be improved by the operation of the magnetic mirror surface 92. In one or more example embodiments of inventive concepts, the process chamber 20 may be formed in a hollow polygonal pillar shape. In this case, the magnets may be arranged in a radial shape about a center portion of the process chamber 20.

In one or more example embodiments of inventive concepts, the magnetic forces of the magnets 51M1 and 51M2 arranged in the radial shape may be the same or substantially the same. In this case, as shown in FIG. 3B, the magnetic mirror surfaces 92 may form a concentric relationship with the process chamber 20. When the magnetic mirror surfaces 92 forming the concentric relationship are formed, as shown, for example, in FIG. 3C, the circular etching scattering may be reduced.

In one or more example embodiments of inventive concepts, heights of the magnets 51M1 and 51M2 may be suitably adjusted with respect to a lower surface of the process chamber 20. In this case, the height of the magnetic mirror surface 92 is changed, and magnetic field distribution may be adjusted. For example, when a distance between the grid 14 and the substrate 26 is changed and/or an amount of deflection of the ion beam is changed, the height of the magnetic mirror surface 92 may be adjusted to reduce the scattering of the ion beam.

The ion beam etching device 100 in accordance with example embodiments of inventive concepts includes a driving part 52. Heights of the magnets 51M1 and 51M2 may be adjusted by the driving part 52. Thus, a magnetic field configured to reduce the scattering generated during the etching process performed in a given (or, alternatively, desired or predetermined) process condition may be provided on the progressing path of the ion beam.

In at least some example embodiments of inventive concepts, the above-described magnets 51M1 and 51M2 may be realized by a permanent magnet and/or an electromagnet. In one example, all of the magnets may be realized by the permanent magnet, or all of the magnets may be realized by the electromagnets. In another example, some of the magnets may be realized by the permanent magnet, and the rest of the magnets may be realized by the electromagnets. When the magnets are the permanent magnets, the distribution of the magnetic field may not be changed without transportation by operation of the driving part 52. When the magnets include the electromagnets, the magnetic field generated by the magnetic field generator 51 may be changed by adjusting a current applied thereto as well as the transportation by operation of the driving part 52. In one or more example embodiments of inventive concepts, the current applied to each of the electromagnets may be adjusted by the controller 54. For example, the current applied to the first electromagnet 51M1 may be adjusted to be greater than the current applied to the second electromagnet 51M2. In this case, as shown in FIG. 4B, an asymmetric magnetic mirror surface 92 may be realized. Thus, as described by sizes of arrow marks of FIGS. 4A and 4B, asymmetric distribution of the magnetic field may be realized, and as shown in FIG. 4C, the asymmetric distribution of the magnetic field may be usefully utilized to reduce the non-uniform and/or asymmetric etching scattering.

According to at least some example embodiments, the amount of the deflection of the ion beam may increase as spacing from the grid 14 increases. In the etching using the ion beam, for example, the scattering tendency is relatively large at a peripheral (edge) portion of the substrate 26. The intensity of the magnetic field may decrease as spacing from the magnet increases. The ion beams incident on the peripheral portion of the substrate 26 may be affected by the magnetic field more than the ion beams incident on the central portion of the substrate 26. The etching scattering phenomenon generated at the peripheral portion of the substrate 26 may be effectively reduced.

Figure 5A:
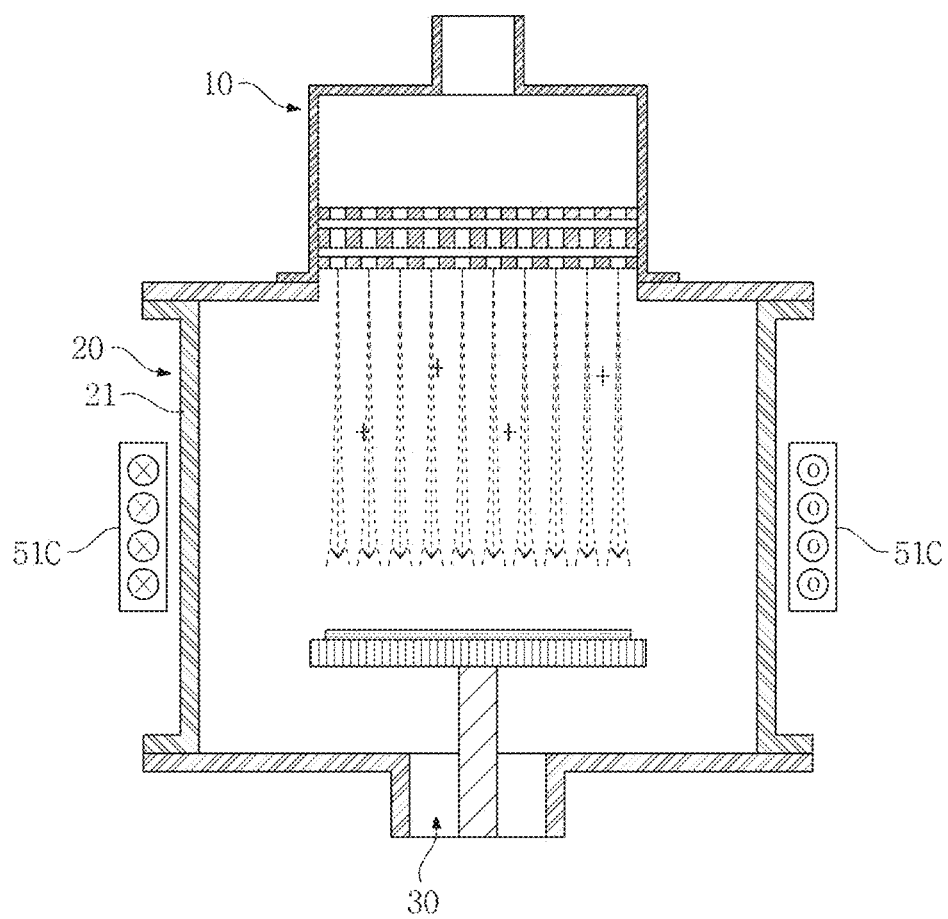
FIG. 5A is a view illustrating an ion beam etching device in accordance with example embodiments of inventive concepts.
Figure 5B:
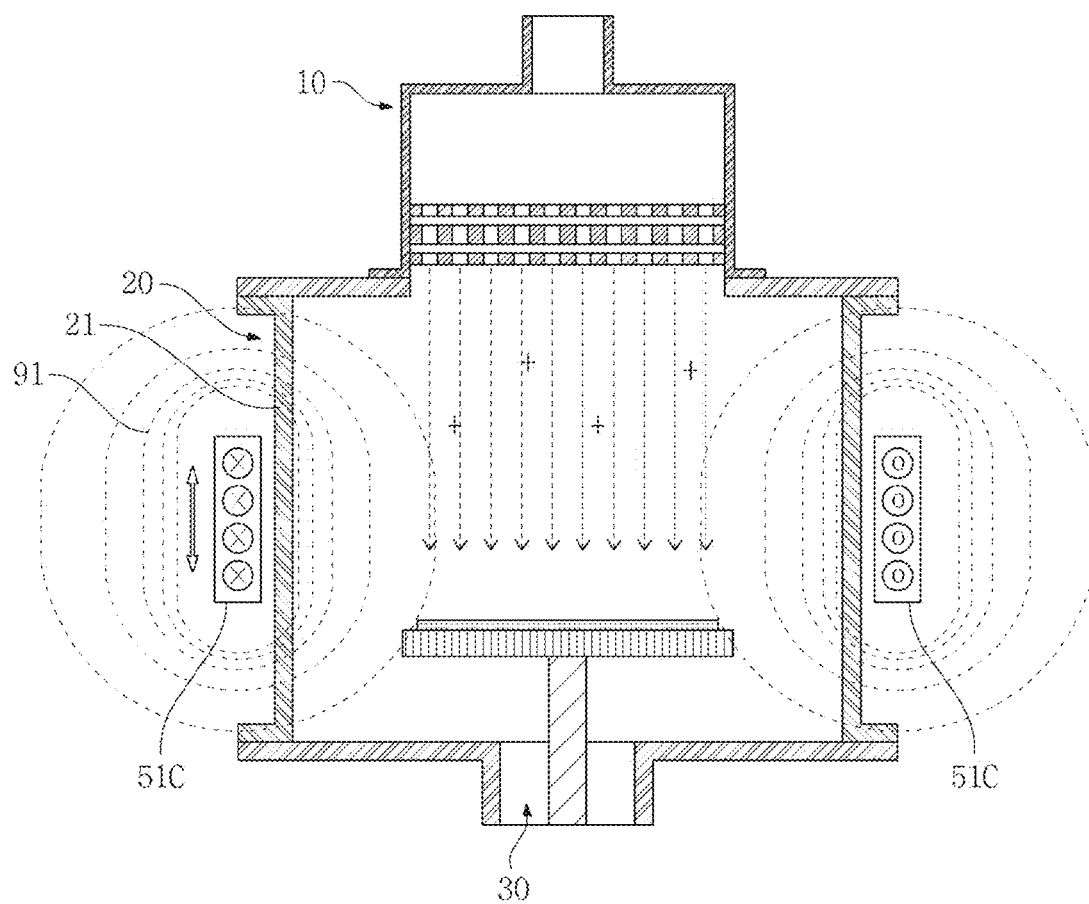
FIG. 5B is a view illustrating an ion beam etching device in accordance with example embodiments of inventive concepts.
Figure 5C:
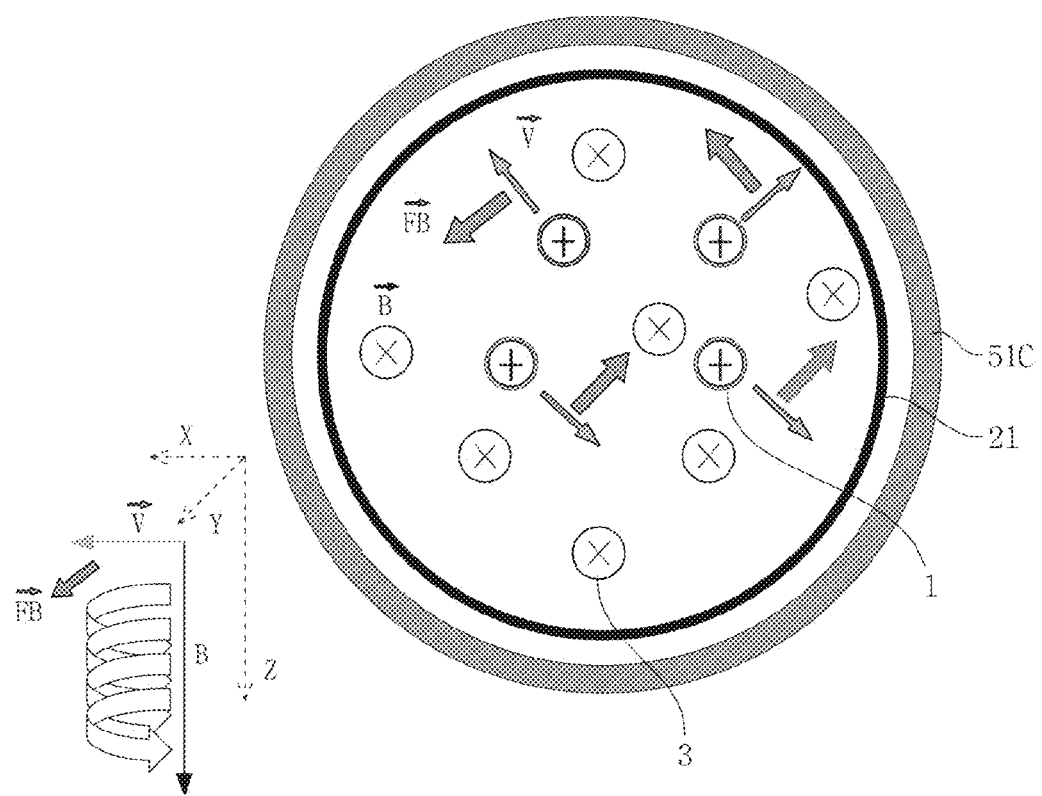
FIG. 5C is a view for describing an example dynamic relationship applied on ions in the ion beam etching device in accordance with example embodiments of inventive concepts.
Figure 6A:
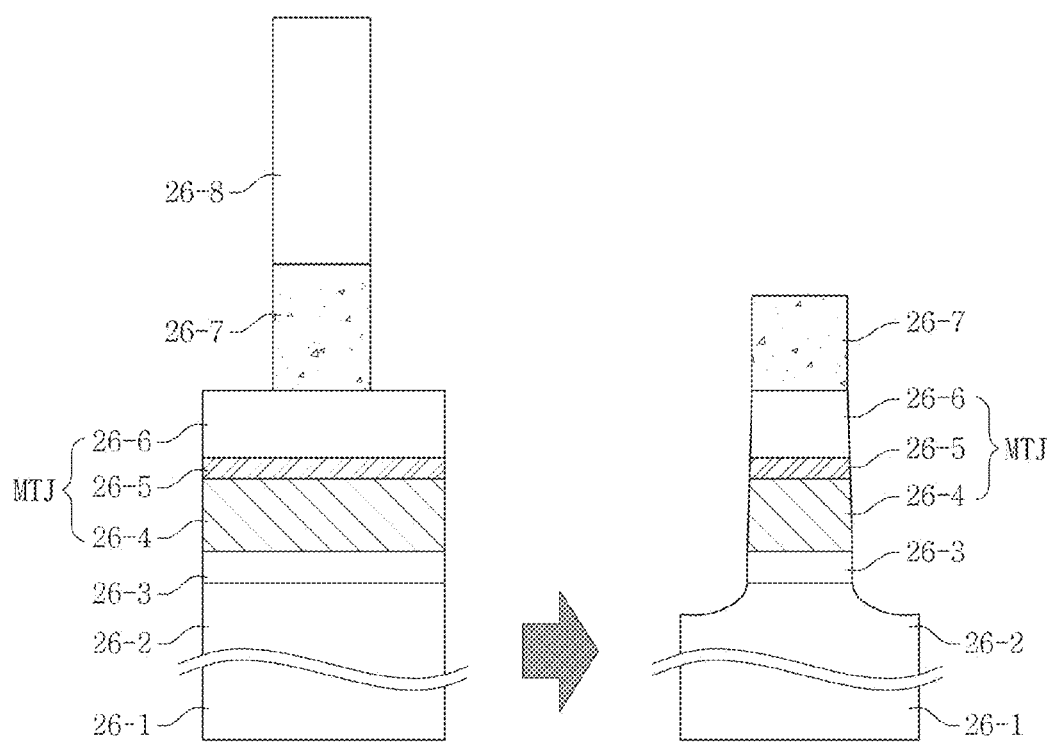
FIG. 6A is a view of an example before and after etching.
Figure 6B:
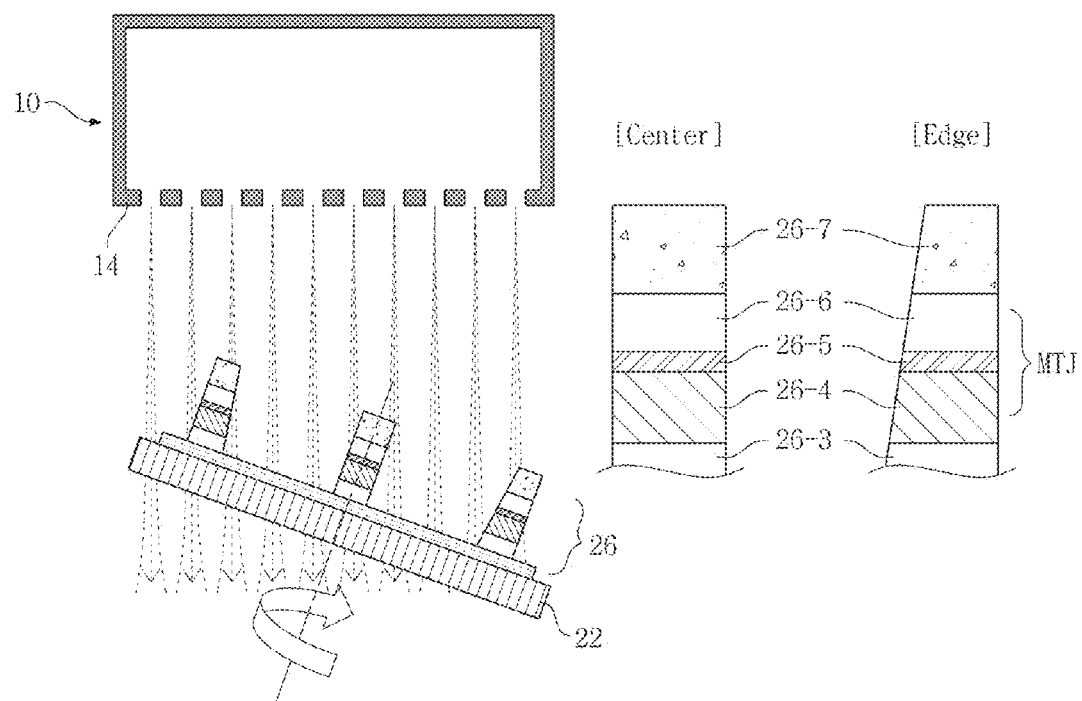
FIG. 6B is a view of an example when etching is performed without application of an etching scattering improvement function.
Figure 6C:
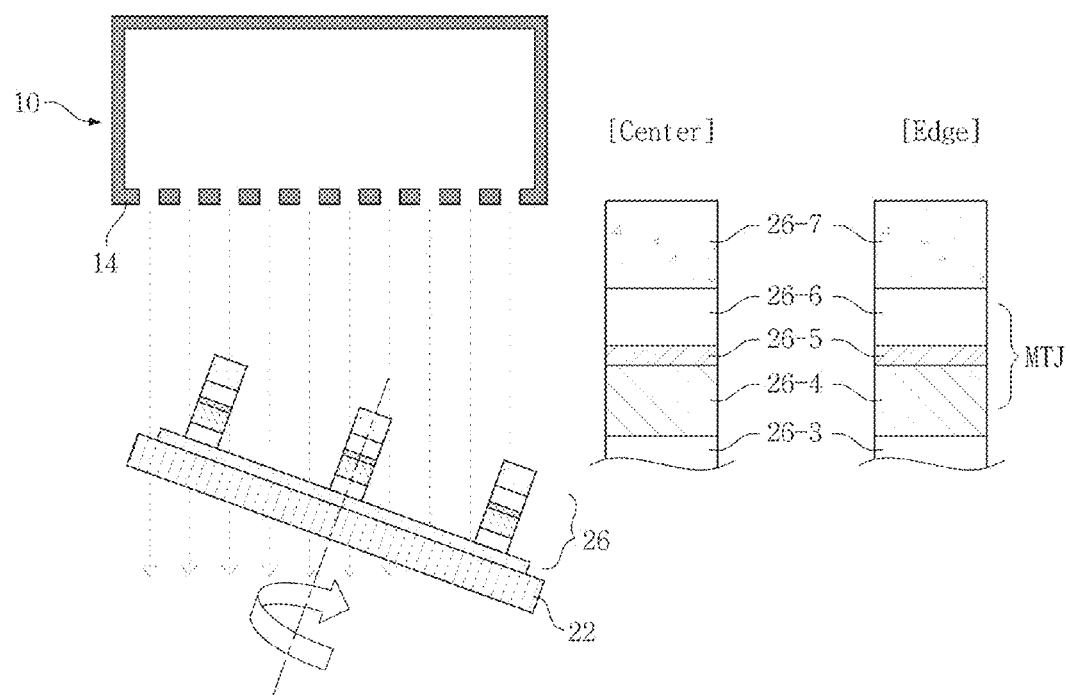
FIG. 6C is a view of an example when etching is performed with application of an etching scattering improvement function in an ion beam etching device in accordance with example embodiments of inventive concepts.

Referring to FIGS. 5A, 5B, and 5C, the variable magnetic field application part 50 may include the coil 51C. For example, the above-described magnetic field generator 51 may be formed of the coil 51C. Although not shown in FIGS. 5A to 5C, a driving part configured to transport the coil 51C or a controller configured to adjust a current applied to the coil 51C may also be formed.

In one or more example embodiments of inventive concepts, the coil 51C may be wound to surround the sidewall 21 of the process chamber 20. For example, an (e.g., one) end of the coil 51C may be adjacent to a lower portion of the process chamber 20 and another end of the coil 51C may be adjacent to an upper portion of the process chamber, and the coil 51C is formed to be wound around the process chamber 20 more than one time. The coil 51C may be in contact (e.g., direct contact) with the sidewall 21 of the process chamber 20, or may be spaced apart from the sidewall 21 of the process chamber 20 by a given (or, alternatively, desired or predetermined) distance. When the coil 51C moves upwardly and downwardly along the sidewall 21 of the process chamber 20, the coil 51C may be spaced apart from the sidewall 21 of the process chamber 20 for transportation of the coil 51C. A coating (not shown) may be formed on the coil 51C, or the coil 51C may be arranged in a case (not shown) configured to reduce friction against the sidewall 21 of the process chamber 20 In this example, the magnetic field generator 51 including the coil 51C may be in contact (e.g., direct contact) with the process chamber 20, and may move along the sidewall 21 of the process chamber 20. In order to move the magnetic field generator 51, the driving part may include a motor (not shown), an oil pressure and/or air pressure cylinder (not shown), and/or the like. The above motor, the cylinder, and/or the like may be prepared inside or outside the magnetic field generator 51.

As shown in FIG. 5A, when the current is not applied to the coil 51C, a divergence phenomenon and/or steering phenomenon of the ion beam may occur. As shown in FIG. 5B, when a suitable current is applied to the coil 51C, the divergence phenomenon and/or the steering phenomenon of the ion beam may be reduced, and thus, the coherence of the ion beam may be improved.

Movement of ions may be understood by vector summation (vector sum) of a vertical direction component toward a lower direction of the process chamber 20 and a lateral direction component toward the sidewall 21 of the process chamber 20. Referring to FIG. 5C, lateral direction movement of the ions 1 in a vertical downward magnetic field generated by the coil 51C receiving the current causes a Lorenz force. For example, when the ions 1 are transported in an X-axis direction, the ions 1 may receive a force toward a Y-axis direction, which is a vertically left side of the movement direction. Thus, the ions 1 perform a rotational movement having a given (or, alternatively, desired or predetermined) radius with respect to an XY plane, and are not affected by the magnetic field 3 in a Z-axis direction. Thus, despite the divergence phenomenon and/or the steering phenomenon, when the progression of the ions 1 is relatively straight, the amount of deviation from a position of incidence may be decreased (e.g., remarkably decreased.) The coherence of the ions 1 may be improved, and thus, the above described etching scattering may be reduced.

In FIG. 6A, cross-sectional structures of magneto-resistance random access memories (MRAMs) in accordance with example embodiments of inventive concepts are classified as before and after etching and described. MRAM is a non-volatile memory device configured to read and write data using a magnetic tunnel junction (MTJ) pattern including two magnetic substances, and an insulating layer interposed therebetween. In a manufacturing process of the MRAM, a remote plasma etching process using an ion beam may be used. In one or more example embodiments of inventive concepts, the MRAM may form a layered structure including a substrate 26-1, an interlayer insulating layer 26-2, a lower electrode 26-3, a fixed magnetic layer 26-4, a tunnel junction layer 26-5, a magnetic free layer 26-6, and an upper electrode 26-7. The fixed magnetic layer 26-4, the tunnel junction layer 26-5, and the magnetic free layer 26-6 are collectively referred to as an MTJ stack. In order to pattern the layered structure, an etching process may be performed after a mask is formed on the magnetic free layer 26-6. The mask may include a metal mask pattern 26-7 and a mask pattern 26-8. The metal mask pattern 26-7 may be formed of tungsten and/or the like. In one or more example embodiments of inventive concepts, the metal mask pattern 26-7 may be formed on the magnetic free layer 26-6. The metal mask pattern 26-7 may be patterned using the mask pattern 26-8. The mask pattern 26-8 may include a photoresist pattern. In at least some example embodiments, the mask pattern 26-8 may be formed of silicon nitride, silicon oxide, silicon oxynitride, and/or the like.

Referring to the left portion of FIG. 6A, an example in which an etching process using the mask pattern 26-8 is performed to form the metal mask pattern 26-7, and layers under the metal mask pattern 26-7 are not etched is illustrated. In this example, the ion beam etching is performed, and thus, the layered structure in which the patterns shown in the right portion of FIG. 6A are patterned may be formed. The lower electrode 26-3, the fixed magnetic layer 26-4, the tunnel junction layer 26-5, the magnetic free layer 26-6, and the metal mask pattern 26-7 may be patterned through the above described ion beam etching process. In at least some example embodiments, the metal mask pattern 26-7 may be utilized as an upper electrode 26-7. Etching ratios with respect to incident angles may be different for different materials. As shown in FIG. 2C, since the incident angle of the stage 22 is adjusted, the layered structure formed of various materials may be etched more precisely. In at least some example embodiments, when the substrate 26 is arranged obliquely, the stage 22 may be rotated and the etching uniformity may be improved.

The substrate 26 having the layered structure shown in FIG. 6A is etched using the ion beam, and example results thereof are shown in FIGS. 6B and 6C. In FIGS. 6A, 6B, and 6C, lateral and vertical ratios and a large and small relationships of the structure are, deformed (e.g., excessively deformed) in order to assist understanding of the layered structure. As shown in FIG. 6B, when the ion beam is scattered by the divergence phenomenon and/or the steering phenomenon, and etching is performed, a non-uniform etching phenomenon may be generated at least at an edge area of the substrate 26. In accordance with one or more example embodiments of inventive concepts, as shown in FIG. 6C, when the etching is performed in a state in which the scattering of the ion beam is reduced, more uniform etching may be possible in the edge area of the substrate 26.

In FIGS. 6A, 6B, and 6C, although the ion beam etching of MRAMs in accordance with example embodiments of inventive concepts is described, ion beam etching devices in accordance with example embodiments of inventive concepts may be utilized in processes of manufacturing various semiconductor devices other than MRAMs.

In the drawings and example embodiments, the magnet, the electromagnet, the coil, and/or the like, are formed outside the process chamber 20. However, the magnet, the electromagnet, the coil, and/or the like may be formed inside the process chamber 20 in accordance with example embodiments. When the magnet, the electromagnet, the coil, and/or the like, are formed outside the process chamber 20, the examples of applying a current and/or moving a position may be effectively realized.

When an etching process is performed using the ion beam etching device 100 in accordance with example embodiments of inventive concepts, the etching scattering is analyzed using a first substrate, and a magnetic field condition is determined based on the detected etching scattering, and the above-described controller 54 and/or the driving part 52 may be operated. For example, the variable magnetic field application part 50 may be operated to realize improved (e.g., optimized) distribution of the lines 91 of the magnetic force to reduce the detected etching scattering. For example, when the asymmetric scattering as shown in FIG. 4C is detected, a current applied to each of the electromagnets is adjusted, and heights of the electromagnets may be adjusted as needed. Thus, the current applied to the electromagnets is determined and/or the height of the electromagnets is controlled, and the substrate 26 to be etched through the etching process may be arranged in the process chamber 20. Then, a current is applied to the electromagnets to generate a magnetic field, and the etching process may be performed. In this case, the detected etching scattering may be reduced using the first substrate.

According to one or more example embodiments of inventive concepts, ion beam etching devices may apply a variable magnetic field on a progressing path of an ion beam. The variable magnetic field may reduce (e.g., remarkably reduce) etching scattering generated by a divergence phenomenon of ion beams, a steering phenomenon, and/or the like, and more accurate etching performance may be realized.

Although a few example embodiments have been described, those skilled in the art will readily appreciate that many modifications are possible in example embodiments without materially departing from inventive concepts. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An ion beam etching device comprising:
an ion source configured to generate ions;
a grid on a side of the ion source, the grid configured to accelerate the generated ions to generate an ion beam;
a process chamber configured to have an etching process using the ion beam performed therein, the process chamber having a cylindrical shape;
a stage in the process chamber, the stage configured to hold a substrate;
a variable magnetic field application part adjacent to the process chamber between the grid and the stage, the variable magnetic field application part configured to apply a variable magnetic field; and
a driving part configured to move the variable magnetic field application part in a vertical direction between the grid and the stage of the process chamber,
wherein the variable magnetic field application part includes electromagnets arranged on an outer surface of the process chamber in a radial shape and a controller configured to adjustably control a current applied to each of the electromagnets,
wherein the controller is configured to simultaneously apply different non-zero currents to separate, respective electromagnets on opposite sides of the process chamber to cause the variable magnetic field to have an asymmetric magnetic field distribution on a plane perpendicular to a progressing path of the ion beam.

2. The ion beam etching device of claim 1, wherein the driving part is configured to move the electromagnets in a direction perpendicular to a surface of the grid.

3. An ion beam etching device comprising:
an ion source configured to generate ions;
a grid on a side of the ion source, the grid configured to accelerate the generated ions to generate an ion beam; and
a variable magnetic field application part configured to apply a variable magnetic field to a progressing path of the ion beam emitted from the grid,
wherein the variable magnetic field application part includes electromagnets arranged on an outer surface of a process chamber in a radial shape and a controller configured to adjustably control a current applied to each of the electromagnets,
wherein the controller is configured to simultaneously apply different non-zero currents to separate, respective electromagnets on opposite sides of the process chamber to cause the variable magnetic field to have an asymmetric magnetic field distribution on a plane perpendicular to the progressing path of the ion beam.

4. An ion beam etching device, comprising:
a chamber including a stage, the stage configured to hold a substrate, the chamber having a cylindrical shape, a wall of the chamber including an upper part, a lower part, and a sidewall, the sidewall excluding the upper part and the lower part of the wall, the sidewall defining a guide part;
an ion beam source configured to output an ion beam toward the stage; and
an electromagnetic force application part configured to apply an electromagnetic force to the ion beam, the electromagnetic force application part including an electromagnetic force generator configured to move along the chamber, and a driving part configured to move the electromagnetic force generator along the guide part between the upper part and the lower part of the wall of the chamber,
wherein the electromagnetic force generator is configured to apply the electromagnetic force asymmetrically within the chamber.

5. The ion beam etching device of claim 4, wherein
the electromagnetic force is a variable electromagnetic force; and
the electromagnetic force generator is configured to generate the variable electromagnetic force based on an applied current.

6. The ion beam etching device of claim 4, wherein the electromagnetic force generator includes at least one of an electromagnet and a coil.

* * * * *